US010868233B2

(12) United States Patent
Ouellette et al.

(10) Patent No.: US 10,868,233 B2
(45) Date of Patent: Dec. 15, 2020

(54) APPROACHES FOR STRAIN ENGINEERING OF PERPENDICULAR MAGNETIC TUNNEL JUNCTIONS (PMTJS) AND THE RESULTING STRUCTURES

(71) Applicant: Intel Corporation, Santa Clara, CA (US)

(72) Inventors: Daniel G. Ouellette, Portland, OR (US); Christopher J. Wiegand, Portland, OR (US); Md Tofizur Rahman, Portland, OR (US); Brian Maertz, Santa Barbara, CA (US); Oleg Golonzka, Beaverton, OR (US); Justin S. Brockman, Portland, OR (US); Kevin P. O'Brien, Portland, OR (US); Brian S. Doyle, Portland, OR (US); Kaan Oguz, Beaverton, OR (US); Tahir Ghani, Portland, OR (US); Mark L. Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/070,415

(22) PCT Filed: Mar. 30, 2016

(86) PCT No.: PCT/US2016/024898
§ 371 (c)(1),
(2) Date: Jul. 16, 2018

(87) PCT Pub. No.: WO2017/171747
PCT Pub. Date: Oct. 5, 2017

(65) Prior Publication Data
US 2019/0027679 A1    Jan. 24, 2019

(51) Int. Cl.
*H01L 43/02* (2006.01)
*H01L 43/08* (2006.01)
(Continued)

(52) U.S. Cl.
CPC ........... *H01L 43/02* (2013.01); *H01L 27/222* (2013.01); *H01L 43/08* (2013.01); *H01L 43/10* (2013.01); *H01L 43/12* (2013.01)

(58) Field of Classification Search
CPC ....... H01L 43/02; H01L 43/10; H01L 27/222; H01L 43/12; H01L 43/08
(Continued)

(56) References Cited

U.S. PATENT DOCUMENTS

| 5,898,548 A * | 4/1999 | Dill ........................ G11B 5/33 360/324.2 |
| 8,836,000 B1 | 9/2014 | Lin |

(Continued)

FOREIGN PATENT DOCUMENTS

| JP | 2013143548 | 7/2014 |
| WO | WO-2016-022210 | 2/2016 |
| WO | WO-2016-039852 | 3/2016 |

OTHER PUBLICATIONS

International Preliminary Report on Patentability for International Patent Application No. PCT/US2016/024898, dated Oct. 11, 2018, 7 pages.

(Continued)

*Primary Examiner* — Mohammad M Hoque
(74) *Attorney, Agent, or Firm* — Schwabe, Williamson & Wyatt, P.C.

(57) ABSTRACT

Strain engineering of perpendicular magnetic tunnel junctions (PMTJs) is described. In an example, a memory structure includes a perpendicular magnetic tunnel junction (pMTJ) element disposed above a substrate. A lateral strain- (Continued)

(a)

(b)

(c)

(d)

inducing material layer is disposed on the pMTJ element. An inter-layer dielectric (ILD) layer disposed laterally adjacent to both the pMTJ element and the lateral strain-inducing material layer.

15 Claims, 8 Drawing Sheets

(51) Int. Cl.
  *H01L 43/12* (2006.01)
  *H01L 27/22* (2006.01)
  *H01L 43/10* (2006.01)
(58) Field of Classification Search
  USPC .......................................................... 257/421
  See application file for complete search history.

(56) References Cited

U.S. PATENT DOCUMENTS

| | | | | |
|---|---|---|---|---|
| 2010/0015800 | A1* | 1/2010 | Hara | C23C 16/16 438/653 |
| 2010/0193888 | A1* | 8/2010 | Gu | H01L 43/08 257/421 |
| 2011/0129946 | A1* | 6/2011 | Zhong | H01L 27/228 438/3 |
| 2011/0188297 | A1* | 8/2011 | Ogimoto | B82Y 25/00 365/158 |
| 2011/0294291 | A1* | 12/2011 | Matsui | H01L 21/3212 438/672 |
| 2013/0015541 | A1* | 1/2013 | Kanaya | H01L 43/08 257/421 |
| 2013/0037862 | A1 | 2/2013 | Kitagawa et al. | |
| 2013/0161768 | A1 | 6/2013 | Khvalkeovskiy et al. | |
| 2014/0197504 | A1* | 7/2014 | Moriyama | G11C 11/161 257/421 |
| 2014/0264679 | A1* | 9/2014 | Lee | H01L 43/12 257/427 |
| 2014/0284734 | A1* | 9/2014 | Kanaya | H01L 43/02 257/421 |
| 2014/0299951 | A1* | 10/2014 | Guo | H01L 43/12 257/421 |
| 2014/0327096 | A1* | 11/2014 | Guo | H01L 43/10 257/421 |
| 2015/0268116 | A1* | 9/2015 | Fuji | C23C 14/50 438/3 |
| 2016/0027998 | A1* | 1/2016 | Mudivarthi | H01L 43/02 257/421 |
| 2017/0279036 | A1* | 9/2017 | Mo | H01L 43/08 |
| 2020/0251652 | A1* | 8/2020 | Hashemi | H01L 27/222 |

OTHER PUBLICATIONS

International Search Report and Written Opinion for International Patent Application No. PCT/US2016/024898 dated Nov. 29, 2016, 10 pgs.
Search Report of European Patent Application No. 16897302.2, dated Oct. 21, 2019, 6 pgs.
Office Action for Taiwan Patent Application No. 106105776, dated Apr. 23, 2020, 5 pgs., with English translation.
Office Action for Taiwan Patent Application No. 106105776, dated Jul. 17, 2020, 3 pgs.

* cited by examiner

APPROACHES FOR STRAIN ENGINEERING OF PERPENDICULAR MAGNETIC TUNNEL JUNCTIONS (PMTJS) AND THE RESULTING STRUCTURES

CROSS-REFERENCE TO RELATED APPLICATION

This patent application is a U.S. National Phase Application under 35 U.S.C. § 371 of International Application No. PCT/US2016/024898, filed Mar. 30, 2016, entitled "APPROACHES FOR STRAIN ENGINEERING OF PERPENDICULAR MAGNETIC TUNNEL JUNCTIONS (PMTJS) AND THE RESULTING STRUCTURES," which designates the United States of America, the entire disclosure of which is hereby incorporated by reference in its entirety and for all purposes.

TECHNICAL FIELD

Embodiments of the invention are in the field of integrated circuit fabrication and, in particular, approaches for strain engineering of perpendicular magnetic tunnel junctions (pMTJs), and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile embedded memory, e.g., on-chip embedded memory with non-volatility can enable energy and computational efficiency. However, there may be density limitations for traditional spin torque transfer magnetoresistive random access memory (STT-MRAM) integration to accommodate large write switching current and select transistor requirements. Specifically, traditional STT-MRAM has a cell size limitation due to the drive transistor requirement to provide sufficient spin current. Furthermore, such memory is associated with large write current (>100 μA) and voltage (>0.7 V) requirements of conventional magnetic tunnel junction (MTJ) based devices.

Magnetic tunnel junction (MTJ) devices, typically comprising a fixed magnetic layer and a free magnetic layer separated by a tunneling barrier layer, utilize a phenomenon known as tunneling magnetoresistance (TMR). For a structure including two ferromagnetic layers separated by a thin insulating tunnel layer, it is more likely that electrons will tunnel through the tunnel material layer when magnetizations of the two magnetic layers are in a parallel orientation than if they are not (non-parallel or antiparallel orientation). As such, the pMTJ can be switched between two states of electrical resistance, one state having a low resistance and one state with a high resistance. The greater the differential in resistance, the higher the TMR ratio: (RAP–Rp)/Rp*100% where Rp and RAP are resistances for parallel and antiparallel alignment of the magnetizations, respectively. The higher the TMR ratio, the more readily a bit can be reliably stored in association with the pMTJ resistive state. The TMR ratio of a given pMTJ is therefore an important performance metric of a spin transfer torque memory (STTM) that employs an pMTJ stack.

For an STTM device, current-induced magnetization switching may be used to set the bit states. Polarization states of a first (free) ferromagnetic layer can be switched relative to a fixed polarization of the second (fixed) ferromagnetic layer via the spin transfer torque phenomenon, enabling states of the pMTJ to be set by application of current. Angular momentum (spin) of the electrons may be polarized through one or more structures and techniques (e.g., direct current, spin-hall effect, etc.). These spin-polarized electrons can transfer their spin angular momentum to the magnetization of the free layer and cause it to precess. As such, the magnetization of the free magnetic layer can be switched by a pulse of current (e.g., in about 1-10 nanoseconds) exceeding a certain critical value, while magnetization of the fixed magnetic layer remains unchanged as long as the current pulse is below some higher threshold associated with the fixed layer architecture.

MTJs with magnetic electrodes having a perpendicular (out of plane of substrate) magnetic easy axis have a potential for realizing higher density memory than in-plane variants. Generally, perpendicular magnetic anisotropy (PMA) can be achieved in the free magnetic layer through interfacial perpendicular anisotropy established by an adjacent layer, such as magnesium oxide (MgO), when the free magnetic layer is sufficiently thin. Thin layers however are often associated with a relatively low coercive field Hc. Techniques and structures that can increase Hc for a given magnetic layer thickness are therefore advantageous, for example to improve pMTJ stability.

As such, significant improvements are still needed in the area of non-volatile memory arrays based on pMTJs.

DESCRIPTION OF THE EMBODIMENTS

Approaches for strain engineering of perpendicular magnetic tunnel junctions (pMTJs)), and the resulting structures, are described. In the following description, numerous specific details are set forth, such as specific magnetic tunnel junction (MTJ) layer regimes, in order to provide a thorough understanding of embodiments of the present invention. It will be apparent to one skilled in the art that embodiments of the present invention may be practiced without these specific details. In other instances, well-known features, such as operations associated with embedded memory, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed STT-MRAM memory arrays including strain-engineered pMTJs. Embodiments may pertain to recessed hardmask backfill approaches for strain engineering of magnetic tunnel junctions.

In accordance with one or more embodiments of the present invention, a method to apply strain application to MTJ devices for control of magnetic properties is described. The method may include initial recess of an MTJ etch hardmask material followed by refill with a stress-engineered material. The approach provides direct control of lateral strain on MTJ devices, especially pMTJ devices, independently of the intrinsic film stress of the MTJ hardmask. In one embodiment, lateral strain on the switching layer of pMTJ devices can be used to control thermal stability of the device via modulation of the coercivity of the magnetic free layer. Implementation of a recess etch and refill process replaces the hardmask with a strain engineered material, in close proximity to the MTJ. In a specific embodiment, implementation of the approach eliminates such sensitivity of the pMTJ performance to hardmask stress conditions. The method may provide for enhanced flexibility for pMTJ strain engineering by eliminating the need to simultaneously optimize both stress and etch masking properties of the hardmask material.

Figure 1:
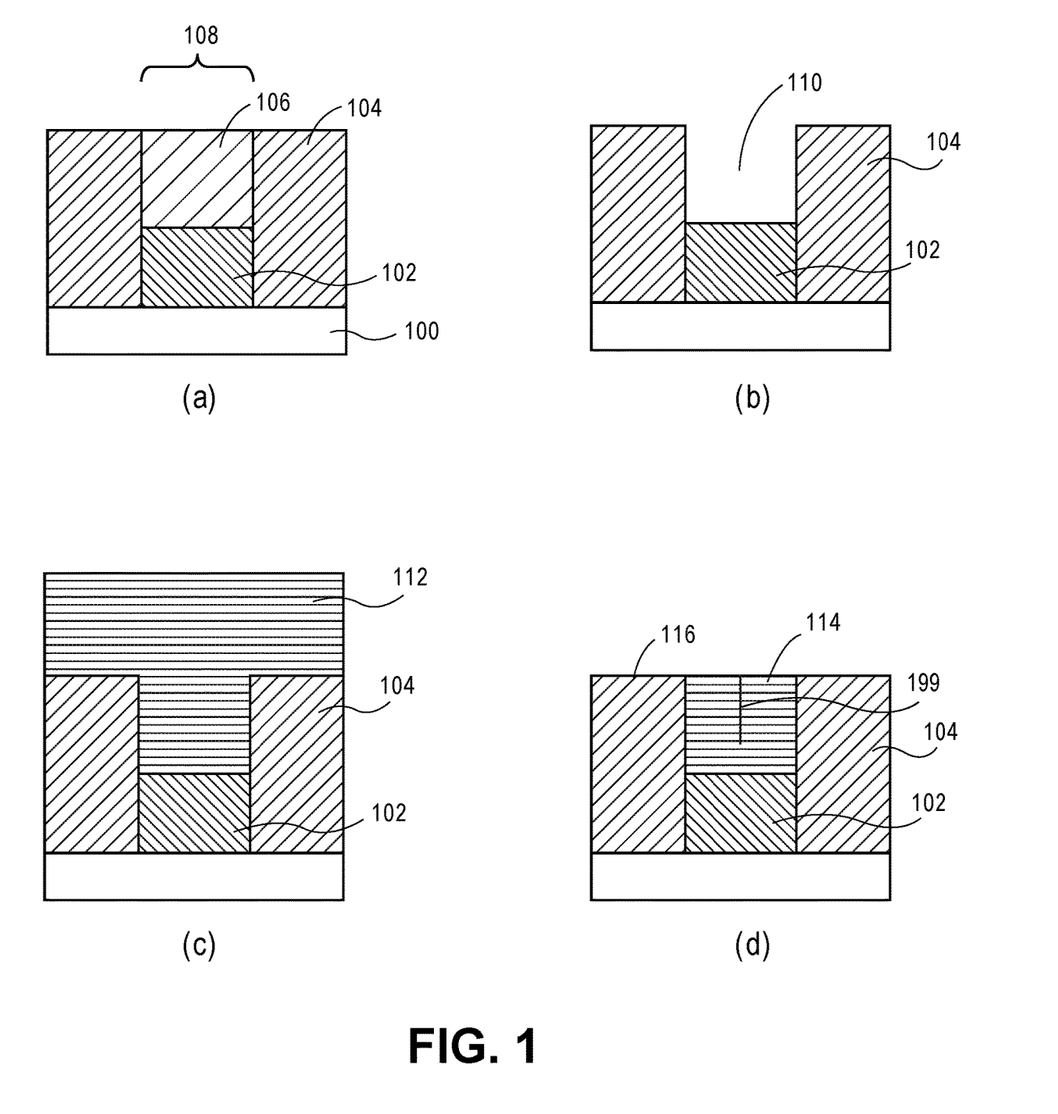
FIG. 1 illustrates cross-sectional views of various operations in a method of fabricating a pMTJ device including a strain engineering layer, in accordance with an embodiment of the present invention.

In an exemplary processing scheme, FIG. 1 illustrates cross-sectional views of various operations in a method of fabricating a pMTJ device including a strain engineering layer, in accordance with an embodiment of the present invention.

Referring to part (a) of FIG. 1, a staring structure includes an MTJ stack 102 disposed above a substrate 100. The MTJ stack 102 is formed within a trench 108 within an inter-layer dielectric (ILD) layer 104. A hardmask layer 106 is formed on the MTJ stack 102, within the trench 108 of ILD layer 104. It is to be appreciated that the MTJ stack 102 may be famed prior to forming the ILD layer 104, or the ILD layer 104 and trench 108 are formed prior to forming the MTJ stack 102.

Referring to part (b) of FIG. 1, the hardmask 106 on MTJ stack 102 is removed to provide an opening 110 within ILD 104 and exposing MTJ stack 102. In an embodiment, the hardmask layer 108 is removed using a selective wet etch process. In another embodiment, the hardmask layer 108 is removed using a selective dry or plasma etch process.

Referring to part (c) of FIG. 1, a strain engineering material 112 is formed over the structure of part (b) of FIG. 1. In an embodiment, the strain engineering material 112 is formed within opening 110 as well as over IUD layer 104, e.g., as a layer having an overburden portion. Depending on the targeted properties of the strain engineering material 112, deposition of the strain engineering material 112 may include a technique such as, but not limited to, physical vapor deposition (PVD), chemical vapor deposition (CVD), atomic layer deposition (ALD), or an electro or electroless plating process.

Referring to part (d) of FIG. 1, the strain engineering material 112 is planarized to remove any overburden of the strain engineering material 112. The planarizing confines a strain engineering layer 114 to opening 110 of ILD layer 104 and re-exposes uppermost surfaces of ILD layer 104. In an embodiment, the strain engineering material 112 is planarized to form strain engineering layer 114 using a chemical mechanical planarization (CMP) process. In another embodiment, the strain engineering material 112 is planarized to form strain engineering layer 114 using an etch back process.

Referring again to part (d) of FIG. 1, in an embodiment then, a memory structure includes a perpendicular magnetic tunnel junction (pMTJ) element 102 disposed above a substrate 100. A lateral strain-inducing material layer 114 is disposed on the pMTJ element 102. An inter-layer dielectric (ILD) layer 104 is disposed laterally adjacent to both the pMTJ element 102 and the lateral strain-inducing material layer 114. In an embodiment, the ILD layer 104 has an uppermost surface co-planar or substantially co-planar with an uppermost surface of the lateral strain-inducing material layer 114, as is depicted in part (d) of FIG. 1. However, in other embodiments, it is not necessary to completely refill the recessed volume with the strain inducing layer to achieve strain enhancing effect. In another embodiment, partial fill with a high stress material is implemented to achieve the desired effect. In one such embodiment, another capping material is formed there above which is more favorable for integration, e.g., an upper capping layer having higher conductivity, better compatibility with subsequent via etches, or providing a harrier for oxidation or diffusion.

In an embodiment, the recess etch approach of FIG. 1 enables close proximity placement of a stress engineered material to an MTJ stack for enhanced MTJ device strain effect. It is to be appreciated that a seam 199 may result, and ultimately be detectable by cross-sectional transmission electron microscopy (TEM) that reveals such a seam 199 in the stress-engineering layer, e.g., between the stress engineering layer 114 and the MTJ stack 102. Furthermore, strain measurements may be performed using nanospot diffraction and measuring coercivity on the fabricated pMTJ devices. It is to be appreciated that embodiments associated with FIG. 1 may provide an improvement over strain engineering of the hardmask material itself (e.g., with a layer above the hardmask), since the hardmask is replaced with a strain engineering layer having targeted properties. In this vein, embodiments described herein can be implemented to relax the film stress requirements for hard mask materials, enabling optimization of the hardmask properties for improved etch or deposition characteristics or reduced manufacturing cost. Embodiments may also realize mitigation or elimination of undesired effects of the intrinsic film stress of the hardmask. Additionally, embodiments can be implemented to engineer thermal stability or potentially critical current independently of free layer thickness.

Referring again to FIG. 1, exemplary materials and structures suitable for substrate 100, MTJ stack 102, or ILD layer 104 are described below. In an embodiment, hardmask 106 is a metal or conductive hardmask layer (or stack of layers) that provides etch resistance during earlier patterning of the layers making up MTJ stack 102. Suitable metal or otherwise conductive hardmask materials include, but are not limited to, one or more of titanium nitride, tantalum nitride, tantalum, titanium, or ruthenium. In other embodiment, however, a dielectric or insulating hardmask material is used. Suitable metal or otherwise conductive hardmask materials include, but are not limited to, one or more of silicon oxide, silicon nitride, or silicon carbide. In either case, in an embodiment, all of hardmask 106 is removed in moving from part (a) to part (b) of FIG. 1. However, in the case that hardmask 106 is a metal or conductive layer, in another embodiment, only a portion of the hardmask is actually recessed, leaving being conductive remnants of the hardmask layer onto which the strain engineering material 112 is subsequently formed. In the case that a remnant of a metal or conductive hardmask layer 106 is retained, for ease of description of embodiments herein, the remnant portion is considered part of an MTJ material stack. Accordingly, whether or not a hardmask portion is retained, the resulting devices are described as an MTJ having a top electrode including a lateral strain-inducing material layer on an MTJ material stack.

In an embodiment, the strain engineering material 112 (ultimately strain engineering layer 114), is a lateral strain-inducing material layer. In one embodiment, the lateral strain-inducing material layer is a compressive lateral strain-inducing material layer (e.g., the lateral strain-inducing material layer is a tensile-stressed material and induces a compressive strain to the underlying pMTJ element). In a specific such embodiment, the compressive lateral strain-inducing material layer is one selected from the group consisting of a chemical vapor deposited titanium material, an atomic layer deposited titanium material, and a chemical vapor deposited tungsten. In another embodiment, the lateral strain-inducing material layer is a tensile lateral strain-inducing material layer (e.g., the lateral strain-inducing material layer is a compressive-stressed material and induces a tensile strain to the underlying pMTJ element). In a specific such embodiment, the tensile lateral strain-inducing material layer is one selected from the group consisting of a tantalum liner and copper fill material stack, a metal film formed by physical vapor deposition, and a metal seed and electroplated metal material stack. Other materials suitable for use as the strain engineering material 112 (ultimately strain engineering layer 114) are described below in association with FIG. 2.

To provide greater detail, in accordance with an embodiment of the present invention, described herein are pMTJ material stacks, STTM devices employing such material stacks, and computing platforms employing such STTM devices. Applications for embodiments described herein include embedded memory, embedded non-volatile memory (NVM), magnetic random access memory (MRAM), and non-embedded or stand-alone memories.

Figure 2:
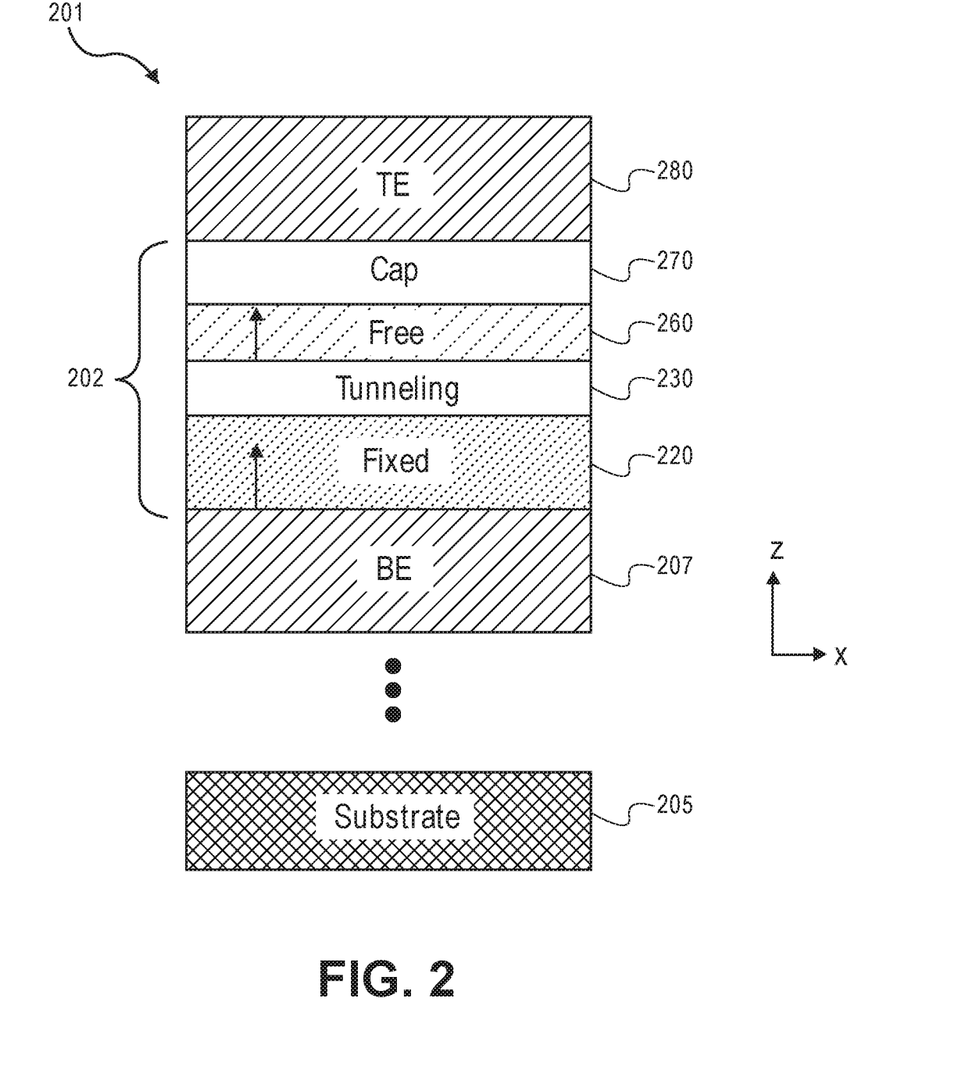
FIG. 2 illustrates a cross-sectional view of a pMTJ device, in accordance with some embodiments of the present invention.

FIG. 2 illustrates a cross-sectional view of a pMTJ device 201, in accordance with some embodiments of the present invention. pMTJ device 201 includes a pMTJ material stack 202 disposed between two electrodes 207 and 280. In the exemplary embodiment, metal electrode 207 (e.g., bottom electrode) is disposed over a substrate 205. A fixed magnetic material layer (or stack) 220 including one or more layers of magnetic material is disposed over electrode 207. A tunneling dielectric material layer 230 is disposed over fixed magnetic material layer or stack 220. A free magnetic material layer (or stack) 260 is disposed over tunneling dielectric material layer 230. In the exemplary embodiment illustrated, a dielectric material layer 270, such as a metal oxide (e.g., MgO, VO, WO, VdO, TaO, HfO, MoO), is disposed over free magnetic material layer 260. Such a capping layer may be absent for spin-hall effect (SHE) implementations. Metal electrode 280 (e.g., top electrode) is disposed over the capping dielectric material layer 270. Notably, the order of the material layers 207-280 may be inverted, or extending laterally away from a topographic feature sidewall, in alternative embodiments. In an embodiment, the top electrode 280 is, or includes, a lateral strain-inducing material layer, as is described in greater detail below.

In some embodiments, pMTJ material stack 202 is a perpendicular system, where spins of the magnetic layers are perpendicular to the plane of the material layers (e.g., the magnetic easy axis is in the z-direction out of the plane of substrate 205). Fixed magnetic layer 220 may be composed of any material or stack of materials suitable for maintaining a fixed magnetization direction while the free magnetic material layer 260 is magnetically softer (e.g., magnetization can easily rotate to parallel and antiparallel state with respect to fixed layer). In some embodiments, a strain-enhanced pMTJ device is provided by application of laterally directed stress sufficient to induce strain in the pMTJ stack parallel to the plane of the pMTJ material layers. In one such embodiment, control of stress in films applied over a pMTJ material stack to provide a significant impact on the coercivity of the magnetic material layers corresponding to strain in one or more of the magnetic material layers.

As indicated briefly above, in an embodiment, the top electrode 280 of the device of FIG. 2 is or includes a lateral strain-inducing material layer. In one such embodiment, the lateral strain-inducing material layer is disposed over a top surface of the pMTJ material stack. Accordingly, in some embodiments, a top-side lateral strain-inducing material layer further functions as the top electrode 280 in a pMTJ device. In some embodiments, the top-side lateral strain-inducing material layer is Ta, either in pure elemental form or an alloy thereof (e.g., TaN, etc.). In other embodiments, the top-side lateral strain-inducing material layer is Ti, either in pure elemental form or an alloy thereof (e.g., TiN, etc.). Any other conductive material that may be tuned to have high tensile stress or highs compressive stress (e.g., 200 MPa, or more) may also be employed. In other embodiments, the strain-inducing material layer is tuned to provide a compressive stress. A top-side lateral strain-inducing material may also be a dielectric (e.g., SiN) capping a pMTJ device electrode. For such embodiments, a conductive via may pass through the lateral strain-inducing material to contact the underlying electrode. In some embodiments, to increase an amount of lateral strain within pMTJ stacks 202, the top-side lateral strain-inducing material layer has a thickness greater than that of any material layer (e.g., magnetic or dielectric) in the pMTJ stack. In some further embodiments, the top-side lateral strain-inducing material layer has a thickness greater than that of the entire underlying pMTJ stack 202.

Figure 3:
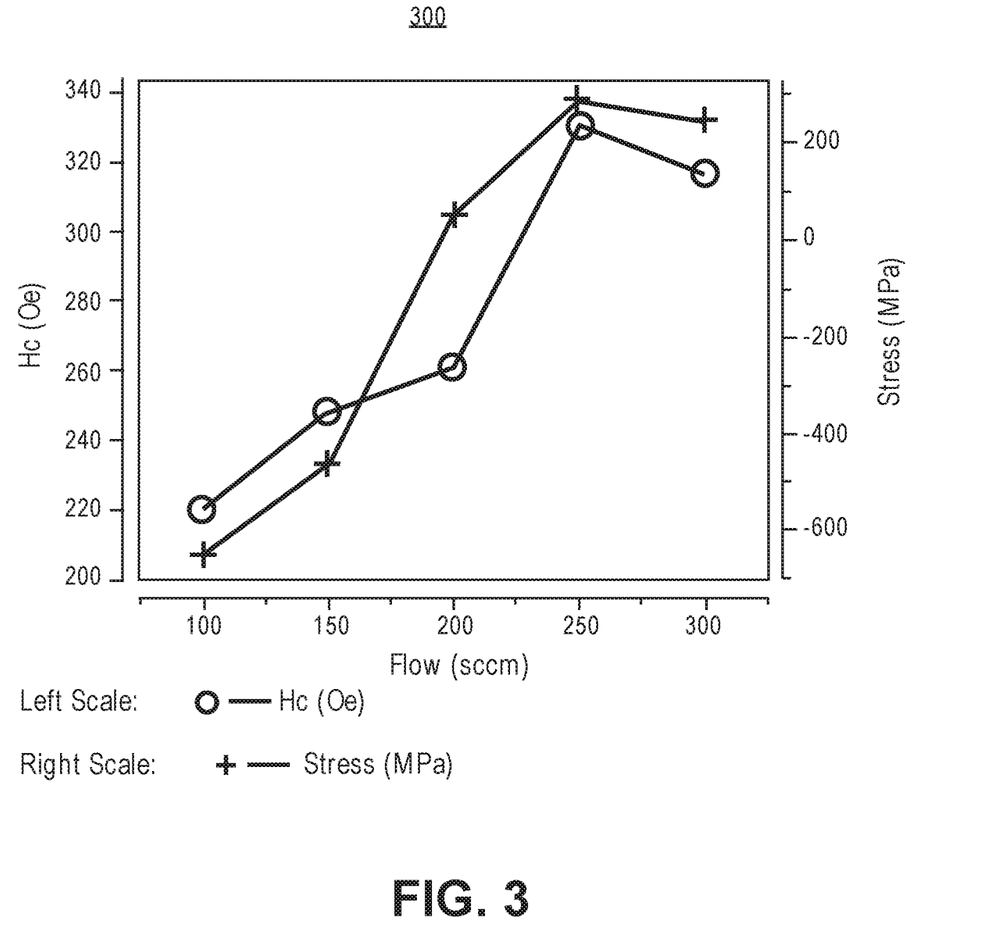
FIG. 3 is a plot showing how free layer coercivity in a blanket MTJ stack varies with the intrinsic stress of a hardmask or top electrode layer, as controlled via sputtering pressure, in accordance with an embodiment of the present invention.
Figure 4:
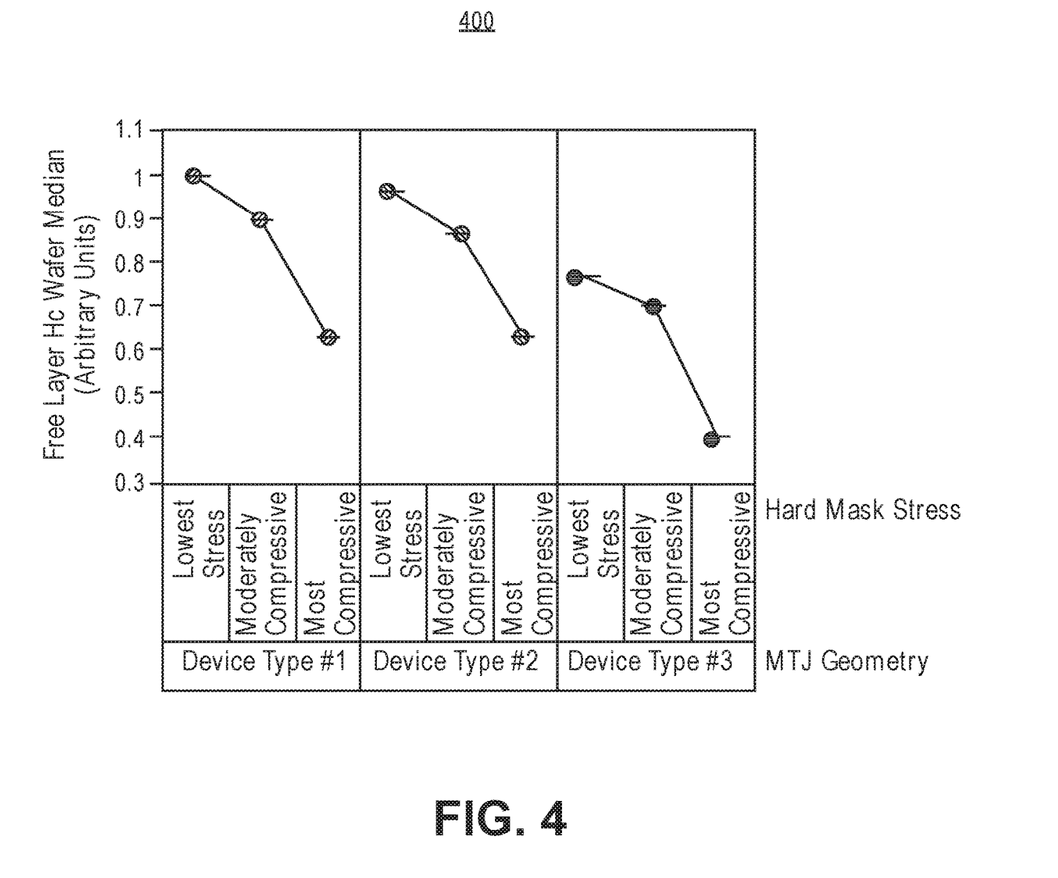
FIG. 4 is a plot of free layer coercivity of pMTJ devices fabricated with different intrinsic hardmask or top electrode stress, in accordance with an embodiment of the present invention.

In accordance with an embodiment of the present invention, the sensitivity of free layer coercivity to lateral strain is exploited, which is illustrated by modulation of the stress of the hardmask or top electrode material itself in (a) blanket MTJ stack measurements or (b) in an integrated pMTJ process flow. FIG. 3 is a plot 300 showing how free layer coercivity in a blanket MTJ stack varies with the intrinsic stress of a hardmask or top electrode layer, as controlled via sputtering pressure, in accordance with an embodiment of the present invention. FIG. 4 is a plot 400 of free layer coercivity of pMTJ devices fabricated with different intrinsic hardmask or top electrode stress, in accordance with an embodiment of the present invention. Referring to plot 400, free layer coercivity is obtained from resistance-field sweeps.

In another aspect, integrating memory directly onto a microprocessor chip is advantageous since it enables higher operation speeds compared to having physically separate logic and memory chips. Unfortunately, traditional charge-based memory technologies such as DRAM and NAND Flash are now facing severe scalability issues related to increasingly precise charge placement and sensing requirements. As such, embedding charge-based memory directly onto a high performance logic chip is not very attractive for future technology nodes. However, a memory technology that does have the potential to scale to much smaller geometries compared to traditional charge-based memories is spin-torque transfer magnetoresistive random access memory (STT-MRAM), since it relies on resistivity rather than charge as the information carrier. However, in order to exploit the potential benefits of a high performance logic chip with embedded STT-MRAM memory, an appropriate integrated logic plus STT-MRAM structure and fabrication method is needed. Embodiments of the present invention include such structures and fabrication processes.

In accordance with one or more embodiments described herein, a structure is disclosed in which spin transfer torque random access memory (STT-MRAM) arrays, which include a multitude of magnetic tunnel junctions (MTJs), are embedded within a back-end interconnect layer of a high performance logic chip. In accordance with a specific embodiment of the present invention, the combination of "thin vias" beneath the MTJs, the presence of an MRAM pedestal material beneath the MTJs, and an MTJ-first type process flow where the MTJs are fabricated prior to the interconnect in the neighboring logic area is disclosed.

Figure 5:
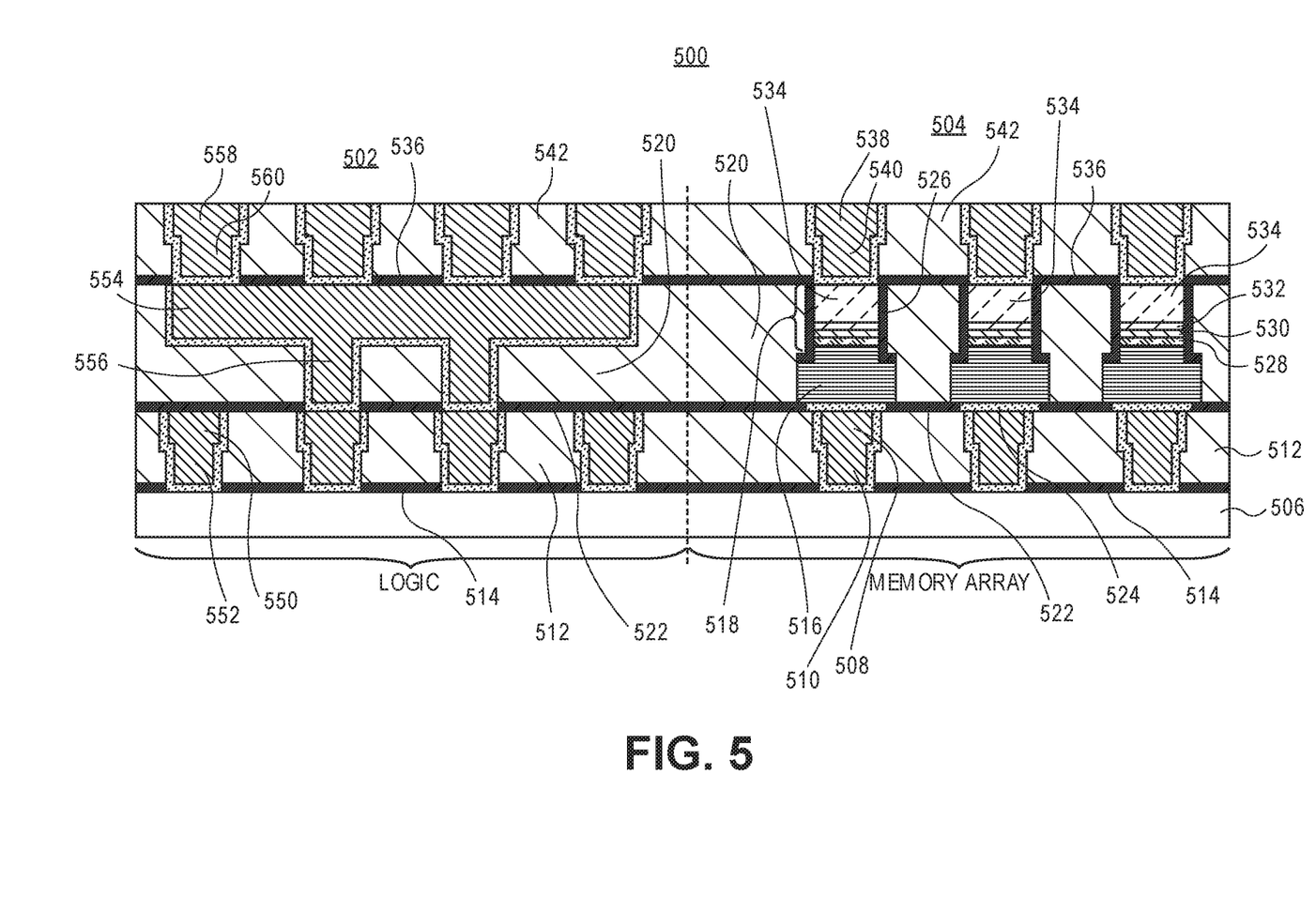
FIG. 5 illustrates a cross-sectional view of a logic region together with a STT-MRAM memory array integrated on a common substrate, in accordance with an embodiment of the present invention.

An STT-MRAM array may be embedded in a logic chip. As an exemplary implementation, FIG. 5 illustrates a cross-sectional view of a logic region together with a STT-MRAM memory array integrated on a common substrate, in accordance with an embodiment of the present invention. Referring to FIG. 5, a structure 500 includes a logic region 502 and a STT-MRAM array region 504.

Referring to the STT-MRAM array region 504 of FIG. 5, in a first layer, metal 2 (M2) 508 and via 1 (V1) 510 structures are formed above a substrate 506. The M2 508 and V1 510 structures are formed in an inter-layer dielectric layer 512 disposed over an etch stop layer 514.

Referring again to the STT-MRAM array region 504 of FIG. 5, in a second layer, a plurality of conductive pedestals 516 and corresponding pMTJ stacks 518 are formed in an inter-layer dielectric layer 520 disposed over an etch stop layer 522. The plurality of conductive pedestals 516 may be coupled to corresponding ones of the M2 508 structures by a conductive layer 524, as is depicted in FIG. 5. A dielectric spacer layer 526 may be formed on sidewalk of the pMTJ stacks 518 and on the upper surface of the plurality of conductive pedestals 516, as is also depicted in FIG. 5. Each of the pMTJ stacks 518 may include a free layer MTJ film or films 528, a dielectric or tunneling layer 530, a fixed layer MTJ film or films 532, and a top electrode 534, as is depicted in FIG. 5. It is to be appreciated that the stack may be reversed, in that layer 528 may be a fixed layer while layer 532 may be a free layer. In an embodiment, the top electrode 534 of the device of FIG. 5 is or includes a lateral strain-inducing material layer. In one such embodiment, the lateral strain-inducing material layer is a compressive lateral strain-inducing material layer. In another such embodiment, the lateral strain-inducing material layer is a tensile lateral strain-inducing material layer.

Referring again to the STT-MRAM array region 504 of FIG. 5, in a third layer, an etch stop layer 536 is disposed on the inter-layer dielectric layer 520. Metal 4 (M4) 538 and via to junction (VTJ) 540 structures are formed in an inter-layer dielectric layer 542 disposed over the etch stop layer 536. It is to be appreciated that additional interconnect layer(s) may be formed on top of the M4/VTJ layers of the STT-MRAM array region 504 of FIG. 5, e.g., using standard dual damascene process techniques that are well-known in the art. Thus, it is also to be appreciated that although in the illustrations the MTJs are shown embedded into a corresponding logic metal 3 (M3) layer, they may instead be embedded into some other interconnect layer (e.g., M1, M2, M4, etc.)

Referring now to the logic region 502 of FIG. 5, in the first layer, metal 2 (M2) 550 and via 1 (V1) 552 structures are formed in the inter-layer dielectric layer 512 disposed over the etch stop layer 514. In the second layer, the etch stop layer 522 is disposed on the inter-layer dielectric layer 512. Metal 3 (M3) 554 and via 2 (V2) 556 structures are formed in the inter-layer dielectric layer 520 disposed over the etch stop layer 522. In the third layer, the etch stop layer 536 is disposed on the inter-layer dielectric layer 520. Metal 4 (M4) 558 and via 3 (V3) 560 structures are formed in the inter-layer dielectric layer 542 disposed over the etch stop layer 536. It is to be appreciated that additional interconnect layer(s) may be formed on top of the M4/V3 layers of the logic region 502 of FIG. 5, e.g., using standard dual damascene process techniques that are well-known in the art.

Referring again to FIG. 5, in an embodiment, the free layer MTJ film or films 528 (or, alternatively, 532) is composed of a material suitable for transitioning between a majority spin and a minority spin, depending on the application. Thus, the free magnetic layer (or memory layer) may be referred to as a ferromagnetic memory layer. In one embodiment, the free magnetic layer is composed of a layer of cobalt iron (CoFe) or cobalt iron boron (CoFeB).

Referring again to FIG. 5, in an embodiment, the dielectric or tunneling layer 530 is composed of a material suitable for allowing current of a majority spin to pass through the layer, while impeding at least to some extent current of a minority spin to pass through the layer. Thus, the dielectric or tunneling layer 530 (or spin filter layer) may be referred to as a tunneling layer. In one embodiment, the dielectric layer is composed of a material such as, but not limited to, magnesium oxide (MgO) or aluminum oxide ($Al_2O_3$). In one embodiment, the dielectric layer has a thickness of approximately 1 nanometer.

Referring again to FIG. 5, in an embodiment, the fixed layer MTJ film or films 532 (or 528 in the case that 532 is a free layer) is composed of a material or stack of materials suitable for maintaining a fixed majority spin. Thus, the fixed magnetic layer (or reference layer) may be referred to as a ferromagnetic layer. In one embodiment, the fixed magnetic layer is composed of a single layer of cobalt iron boron (CoFeB). However, in another embodiment, the fixed magnetic layer is composed of a cobalt iron boron (CoFeB) layer, ruthenium (Ru) layer, cobalt iron boron (CoFeB) layer stack. In an embodiment, although not depicted, a synthetic antiferromagnet (SAF) is disposed on or adjacent the fixed layer MTJ film or films 532.

Referring again to FIG. 5, in an embodiment, the plurality of conductive pedestals 516 includes a thick metal layer, such as a relatively thick titanium nitride (TiN) layer. In an embodiment, the conductive metal layer 524 is a tantalum nitride (TaN) layer. In one embodiment, the conductive metal layer 524 is referred to as a "thin via" layer. In an embodiment, the top electrode 534 is or includes a lateral strain-inducing material layer, examples of which are described above and also in association with FIGS. 1 and 2.

Referring again to FIG. 5, in an embodiment, one or more interlayer dielectrics (ILD), such as inter-layer dielectric material layers 512, 520 and 542, are used. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Referring again to FIG. 5, in an embodiment, the metal lines (such as M2, M3, and M4) and vias (such as V1, V2, V3 and VTJ) are composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

Referring again to FIG. 5, in an embodiment, etch stop materials (such as for layers 514, 522 and 536, are composed of dielectric materials different from the interlayer dielectric material. In some embodiments, an etch stop layer includes a layer of a nitride of silicon (e.g., silicon nitride) or a layer of an oxide of silicon, or both, or a combination thereof. Other suitable materials may include carbon-based materials, such as silicon carbide. Alternatively, other etch stop layers known in the art may be used depending upon the particular implementation. The etch stop layers maybe formed by CVD, PVD, or by other deposition methods. In an embodiment, the dielectric spacer layer 526 is a silicon nitride layer.

Referring again to FIG. 5, in an embodiment, substrate 506 (or substrate 100 or 205 described below in association with FIGS. 1 and 2, respectively) is a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

It is to be appreciated that the layers and materials described in association with FIGS. 1, 2 and 5 are typically formed on or above an underlying semiconductor substrate or structure, such as underlying device layer(s) of an integrated circuit. In an embodiment, an underlying semiconductor substrate 100, 205 or 506 represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. In one embodiment, the illustrated structures depicted in FIGS. 1, 2 and 5 are fabricated on underlying transistor or other semiconductor device layer(s) formed in or above the substrate 100, 205 or 506. In another embodiment, the illustrated structures depicted in FIGS. 1, 2 and 5 are fabricated on underlying lower level interconnect layers formed above the substrate 100, 205 or 506.

It is to be appreciated that in certain aspects and at least some embodiments of the present invention, certain terms hold certain definable meanings. For example, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric or tunneling oxide, is one located between free and fixed magnetic layers. A fixed magnetic layer may be patterned to create inputs and outputs to an associated circuit. Magnetization may be written by spin hall effect. Magnetization may be read via the tunneling magneto-resistance effect while applying a voltage. In an embodiment, the role of the dielectric layer is to cause a large magneto-resistance ratio. The magneto-resistance is the ratio of the difference between resistances when the two ferromagnetic layers have anti-parallel magnetizations and the resistance of the state with the parallel magnetizations.

In an embodiment, the MTJ functions essentially as a resistor, where the resistance of an electrical path through the MTJ may exist in two resistive states, either "high" or "low," depending on the direction or orientation of magnetization in the free magnetic layer and in the fixed magnetic layer. In the case that the spin direction is of minority in the free magnetic layer, a high resistive state exists, wherein direction of magnetization in the free magnetic layer and the fixed magnetic layer are substantially opposed or anti-parallel with one another. In the case that the spin direction is of majority in the free magnetic layer, a low resistive state exists, wherein the direction of magnetization in the free magnetic layer and the fixed magnetic layer is substantially aligned or parallel with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

Thus, the MTJ may store a single bit of information ("0" or "1") by its state of magnetization. The information stored in the MTJ is sensed by driving a current through the MTJ. The free magnetic layer does not require power to retain its magnetic orientations. As such, the state of the MTJ is preserved when power to the device is removed. Therefore, a memory bit cell such as depicted in FIG. 1 is, in an embodiment, non-volatile.

In accordance with an embodiment of the present invention, each bit of data is stored in a separate magnetic tunnel junction (MTJ). The MTJ is a magnetic element that includes two magnetic layers separated by a thin insulating tunnel barrier layer. One of the magnetic layers is referred to as the reference layer, the fixed layer, or the pinned magnetic layer, and it provides a stable reference magnetic orientation. The bit is stored in the second magnetic layer which is called the free layer, and the orientation of the magnetic moment of the free layer can be either in one of two states—parallel to the reference layer or anti-parallel to the reference layer. Because of the tunneling magneto-resistance (TMR) effect, the electrical resistance of the anti-parallel state is significantly higher compared to the parallel state. To write information in a STT-MRAM device, the spin transfer torque effect is used to switch the free layer from the parallel to anti-parallel state and vice versa. The passing of current through the MTJ produces spin polarized current, which results in a torque being applied to the magnetization of the free layer. When the spin polarized current is sufficiently strong, enough torque is applied to the free layer to cause its magnetic orientation to change, thus allowing for bits to be written. To read the stored bit, the sensing circuitry measures the resistance of the MTJ. Since the sensing circuitry needs to determine whether the MTJ is in the low resistance (e.g. parallel) state or in the high resistance state (e.g. anti-parallel) with acceptable signal-to-noise, the STT-MRAM cell needs to be designed such that the overall electrical resistance and resistance variation of the cell are minimized.

Relating to one or more embodiments described herein, it is to be appreciated that traditional DRAM memory is facing severe scaling issues and, so, other types of memory devices are being actively explored in the electronics industry. One future contender is STT-MRAM devices. Embodiments described herein include a fabrication method for embedding STT-MRAM bit cell arrays into a logic process technology. Embodiments described may be advantageous for processing schemes involving the fabrication of logic processors with embedded memory arrays.

In an embodiment, transistors associated with substrate 100, 205 or 506 are metal-oxide-semiconductor field-effect transistors (MOSFET or simply MOS transistors), fabricated on the substrate 100, 205 or 506. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, each MOS transistor of substrate 100, 205 or 506 includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafinum, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer of each MOS transistor of substrate 100, 205 or 506 is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

Figure 6:
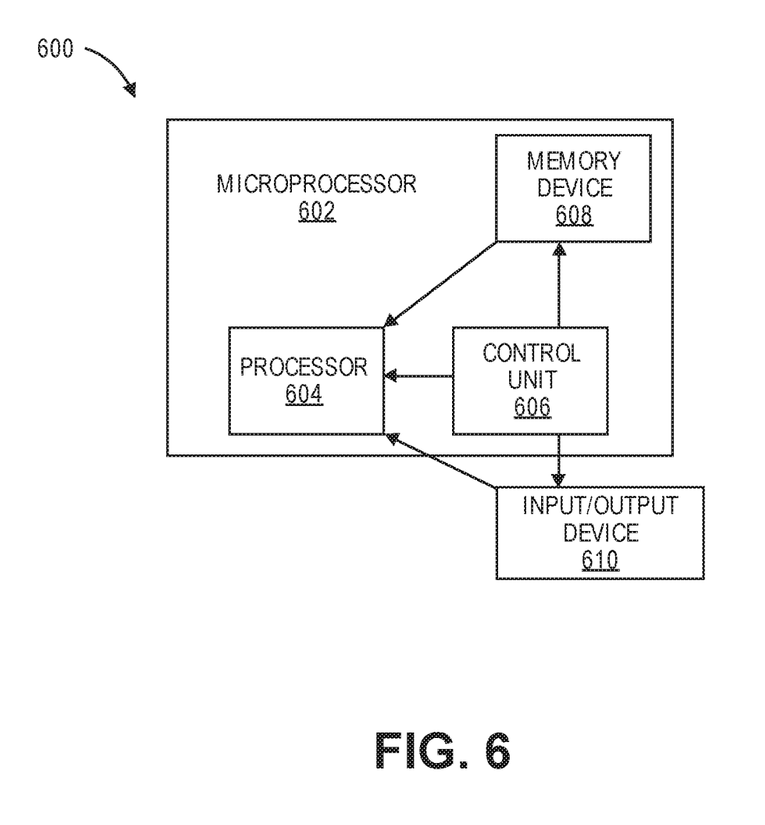
FIG. 6 illustrates a block diagram of an electronic system, in accordance with an embodiment of the present invention.

FIG. 6 illustrates a block diagram of an electronic system 600, in accordance with an embodiment of the present invention. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be understood that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include STT-MRAM memory arrays integrated into a logic processor, as described herein. In an embodiment, the memory device 608 is embedded in the microprocessor 602, as depicted in FIG. 6.

Figure 7:
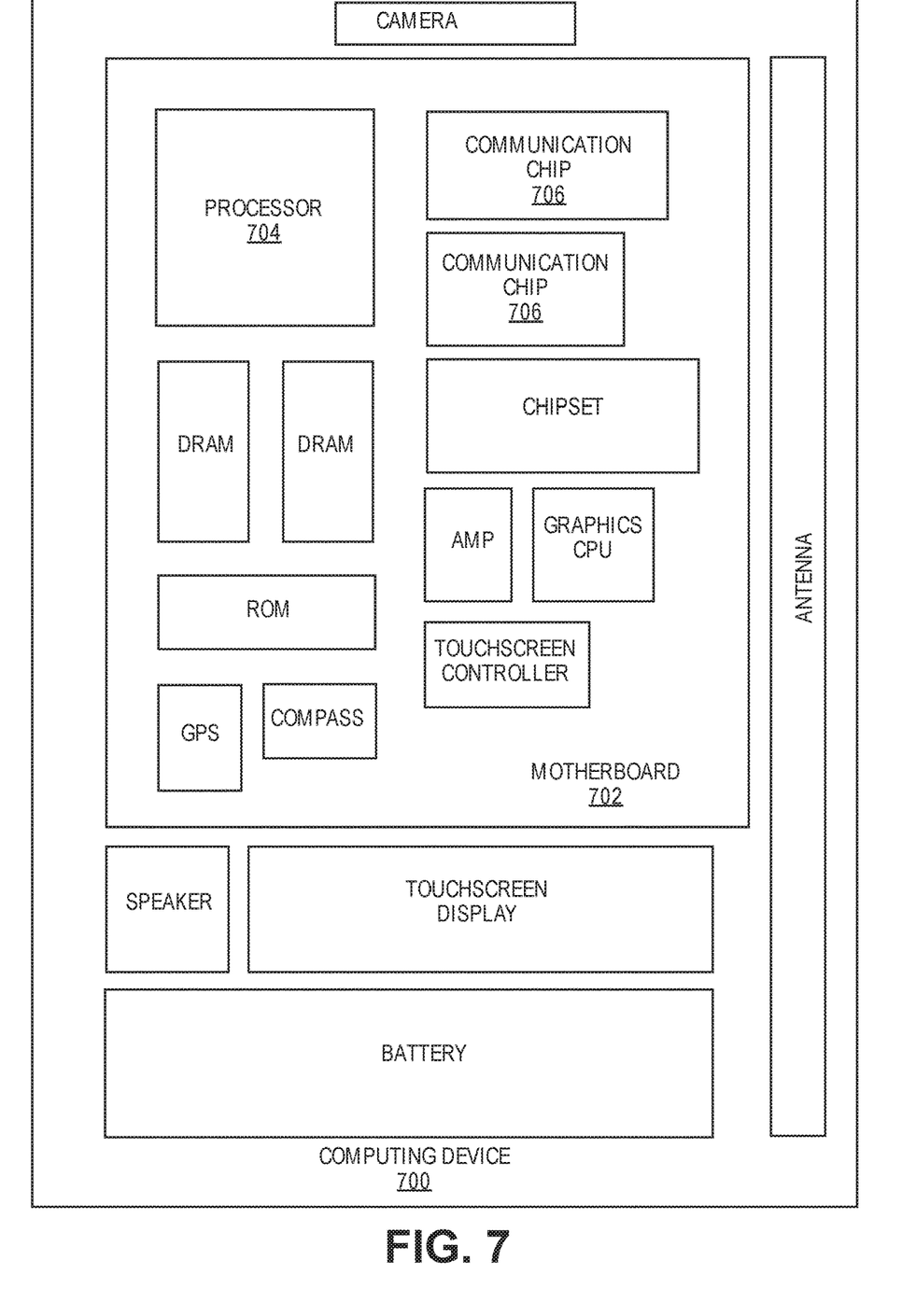
FIG. 7 illustrates a computing device in accordance with one embodiment of the invention.

FIG. 7 illustrates a computing device 700 in accordance with one embodiment of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of embodiments of the invention, the integrated circuit die of the processor includes one or more arrays, such as strain engineered pMTJ-based STT-MRAM memory arrays integrated into a logic processor, built in accordance with embodiments of the present invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of an embodiment of the invention, the integrated circuit die of the communication chip includes strain engineered pMTJ-based STT-MRAM memory arrays integrated into a logic processor, built in accordance with embodiments of the present invention.

In further implementations, another component housed within the computing device 700 may contain a stand-alone integrated circuit memory die that includes one or more arrays, such as strain engineered pMTJ-based STT-MRAM memory arrays integrated into a logic processor, built in accordance with embodiments of the present invention.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Accordingly, one or more embodiments of the present invention relate generally to the fabrication of embedded microelectronic memory. The microelectronic memory may be non-volatile, wherein the memory can retain stored information even when not powered. One or more embodiments of the present invention relate to the fabrication of strain engineered pMTJ-based STT-MRAM memory arrays integrated into a logic processor. Such arrays may be used in an embedded non-volatile memory, either for its non-volatility, or as a replacement for embedded dynamic random access memory (eDRAM). For example, such an array may be used for 1T-1X memory or 2T-1X memory (X=capacitor or resistor) at competitive cell sizes within a given technology node.

Figure 8:
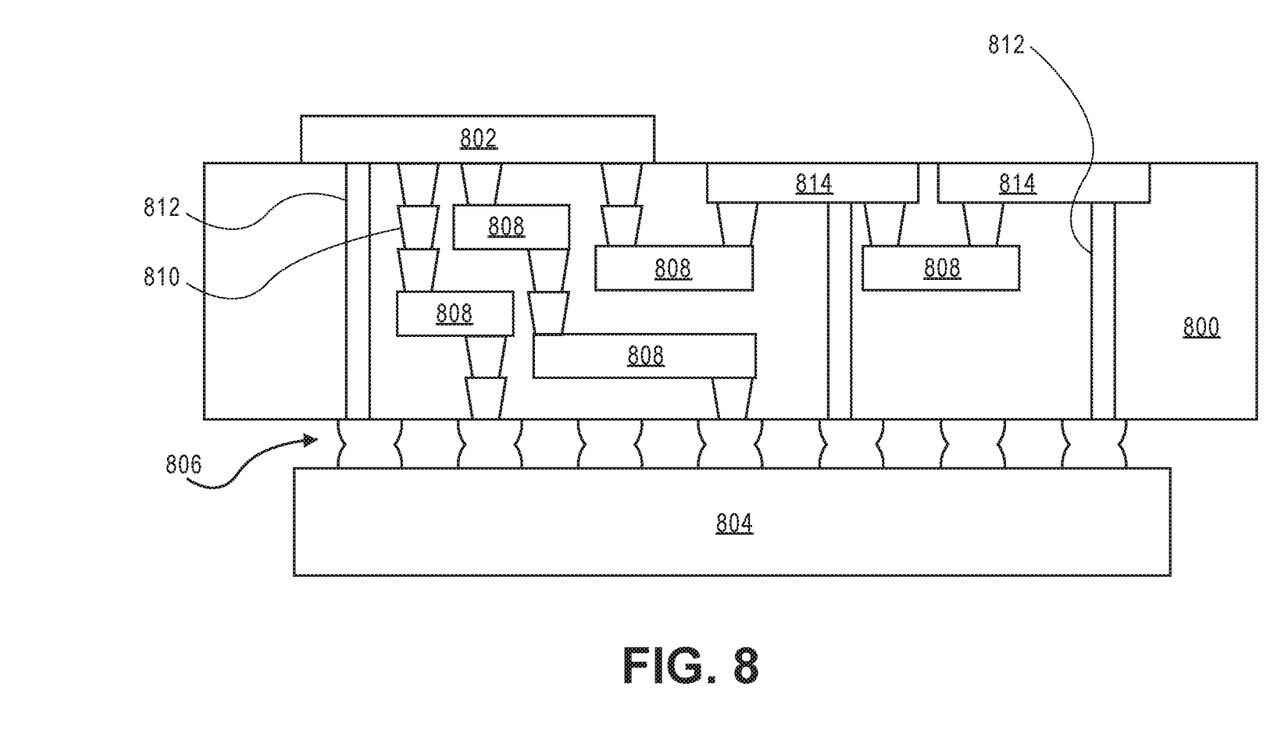
FIG. 8 illustrates an interposer that includes one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball arid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

Thus, embodiments of the present invention include approaches for strain engineering of perpendicular magnetic tunnel junctions (pMTJs), and the resulting structures.

In an embodiment, a memory structure includes a perpendicular magnetic tunnel junction (pMTJ) element disposed above a substrate. A lateral strain-inducing material layer is disposed on the pMTJ element. An inter-layer dielectric (ILD) layer is disposed laterally adjacent to both the pMTJ element and the lateral strain-inducing material layer. The ILD layer has an uppermost surface co-planar or substantially co-planar with an uppermost surface of the lateral strain-inducing material layer.

In one embodiment, the lateral strain-inducing material layer is a compressive lateral strain-inducing material layer.

In one embodiment, the compressive lateral strain-inducing material layer includes a material selected from the group consisting of titanium and tungsten.

In one embodiment, the lateral strain-inducing material layer is a tensile lateral strain-inducing material layer.

In one embodiment, the tensile lateral strain-inducing material layer includes a tantalum liner and copper fill material stack.

In one embodiment, the pMTJ element is disposed on a conductive pedestal.

In one embodiment, the ILD layer is also laterally adjacent to the conductive pedestal.

In an embodiment, a method of fabricating a memory structure includes forming a perpendicular magnetic tunnel junction (pMTJ) element above a substrate, the pMTJ having a hardmask layer formed thereon. The method also includes forming an inter-layer dielectric (ILD) layer laterally adjacent to both the pMTJ element and the hardmask layer. The method also includes at least partially recessing the hardmask layer to form an opening in the ILD. The method also includes forming a strain-inducing material over the ILD layer and in the opening. The method also includes planarizing the strain-inducing material to expose the ILD layer and to form a lateral strain-inducing material layer on the pMTJ element.

In one embodiment, at least partially recessing the hardmask layer includes completely removing the hardmask layer.

In one embodiment, the hardmask layer is a metal or conductive hardmask layer.

In one embodiment, the hardmask layer is a dielectric or insulating hardmask layer.

In one embodiment, forming the strain-inducing material includes forming a compressive lateral strain-inducing material.

In one embodiment, forming the compressive lateral strain-inducing material includes forming a material selected from the group consisting of a chemical vapor deposited titanium material, an atomic layer deposited titanium material, and a chemical vapor deposited tungsten.

In one embodiment, forming the strain-inducing material includes forming a tensile lateral strain-inducing material.

In one embodiment, forming the tensile lateral strain-inducing material includes forming a material selected from the group consisting of a tantalum liner and copper fill material stack, a metal film formed by physical vapor deposition, and a metal seed and electroplated metal material stack.

In an embodiment, a semiconductor structure includes a plurality of metal 2 (M2) line/via 1 (V1) pairings disposed in a first dielectric layer disposed above a substrate. The semiconductor structure also includes a plurality of metal 3 (M3) line/via 2 (V2) pairings and a plurality of perpendicular magnetic tunnel junctions (pMTJs) disposed in a second dielectric layer disposed above the first dielectric layer, the plurality of M3/V2 pairings coupled to a first portion of the plurality of M2/V1 pairings, and the plurality of pMTJs coupled to a second portion of the plurality of M2/V1 pairings. Each of the plurality of pMTJs has a top electrode including a lateral strain-inducing material layer on a MTJ material stack. The semiconductor structure also includes a plurality of metal 4 (M4) line/via 3 (V3) pairings and a plurality of metal 4 (M4) line/via to junction (VTJ) pairings disposed in a third dielectric layer disposed above the second dielectric layer, the plurality of M4/V3 pairings coupled to the plurality of M3/V2 pairings, and the plurality of M4/VTJ pairings coupled to the plurality of pMTJs.

In one embodiment, the lateral strain-inducing material layer is a compressive lateral strain-inducing material layer.

In one embodiment, the lateral strain-inducing material layer is a tensile lateral strain-inducing material layer.

In one embodiment, each of the plurality of pMTJs is disposed on a corresponding one of a plurality of conductive pedestals disposed in the second dielectric layer.

In one embodiment, each of the plurality of conductive pedestals includes a material selected from the group consisting of titanium nitride, tantalum nitride, tantalum, ruthenium and cobalt.

In one embodiment, each of the plurality of conductive pedestals is wider than the corresponding one of the plurality of pMTJs disposed thereon.

In one embodiment, the semiconductor structure further includes a dielectric spacer layer disposed along sidewalls of each of the plurality of pMTJs.

In one embodiment, the dielectric spacer layer extends onto exposed top surfaces of each of the plurality of conductive pedestals.

What is claimed is:
1. A memory structure, comprising:
a perpendicular magnetic tunnel junction (pMTJ) element disposed on a bottom electrode above a substrate;

a top electrode above the pMTJ element, the top electrode comprising a lateral strain-inducing material layer disposed on the pMTJ element, wherein the lateral strain-inducing material layer comprises a seam therein; and an inter-layer dielectric (ILD) layer disposed laterally adjacent to both the pMTJ element and the lateral strain-inducing material layer, the ILD layer having an uppermost surface co-planar with an uppermost surface of the lateral strain-inducing material layer.

2. The memory structure of claim 1, wherein the lateral strain-inducing material layer is a compressive lateral strain-inducing material layer.

3. The memory structure of claim 2, wherein the compressive lateral strain-inducing material layer comprises a material selected from the group consisting of titanium and tungsten.

4. The memory structure of claim 1, wherein the lateral strain-inducing material layer is a tensile lateral strain-inducing material layer.

5. The memory structure of claim 4, wherein the tensile lateral strain-inducing material layer comprises a tantalum liner and copper fill material stack.

6. The memory structure of claim 1, wherein the pMTJ element is disposed on a conductive pedestal.

7. The memory structure of claim 1, wherein the ILD layer is also laterally adjacent to the conductive pedestal.

8. A semiconductor structure, comprising:
a plurality of metal 2 (M2) line/via 1 (V1) pairings disposed in a first dielectric layer disposed above a substrate;
a plurality of metal 3 (M3) line/via 2 (V2) pairings and a plurality of perpendicular magnetic tunnel junctions (pMTJs) disposed in a second dielectric layer disposed above the first dielectric layer, the plurality of M3/V2 pairings coupled to a first portion of the plurality of M2/V1 pairings, and the plurality of pMTJs coupled to a second portion of the plurality of M2/V1 pairings, wherein each of the plurality of pMTJs has a top electrode comprising a lateral strain-inducing material layer on a MTJ material stack, wherein the lateral strain-inducing material layer comprises a seam therein; and
a plurality of metal 4 (M4) line/via 3 (V3) pairings and a plurality of metal 4 (M4) line/via to junction (VTJ) pairings disposed in a third dielectric layer disposed above the second dielectric layer, the plurality of M4/V3 pairings coupled to the plurality of M3/V2 pairings, and the plurality of M4/VTJ pairings coupled to the plurality of pMTJs.

9. The semiconductor structure of claim 8, wherein the lateral strain-inducing material layer is a compressive lateral strain-inducing material layer.

10. The semiconductor structure of claim 8, wherein the lateral strain-inducing material layer is a tensile lateral strain-inducing material layer.

11. The semiconductor structure of claim 8, wherein each of the plurality of pMTJs is disposed on a corresponding one of a plurality of conductive pedestals disposed in the second dielectric layer.

12. The semiconductor structure of claim 11, wherein each of the plurality of conductive pedestals comprises a material selected from the group consisting of titanium nitride, tantalum nitride, tantalum, ruthenium and cobalt.

13. The semiconductor structure of claim 11, wherein each of the plurality of conductive pedestals is wider than the corresponding one of the plurality of pMTJs disposed thereon.

14. The semiconductor structure of claim 13, further comprising:
a dielectric spacer layer disposed along sidewalls of each of the plurality of pMTJs.

15. The semiconductor structure of claim 14, wherein the dielectric spacer layer extends onto exposed top surfaces of each of the plurality of conductive pedestals.

* * * * *